(12) United States Patent
Raynham

(10) Patent No.: US 6,418,068 B1
(45) Date of Patent: Jul. 9, 2002

(54) SELF-HEALING MEMORY

(75) Inventor: Michael B. Raynham, Los Gatos, CA (US)

(73) Assignee: Hewlett-Packard Co., Palo Alto, CA (US)

( * ) Notice: Subject to any disclaimer, the term of this patent is extended or adjusted under 35 U.S.C. 154(b) by 0 days.

(21) Appl. No.: 09/766,354

(22) Filed: Jan. 19, 2001

(51) Int. Cl.[7] .................................................. G11C 7/00
(52) U.S. Cl. .................................. 365/200; 365/230.03
(58) Field of Search ................................ 365/200, 149, 365/233, 230.03

(56) References Cited

U.S. PATENT DOCUMENTS

| | | | |
|---|---|---|---|
| 5,379,258 A | 1/1995 | Murakami et al. | 365/200 |
| 5,877,986 A * | 3/1999 | Harari et al. | 365/185.33 |
| 6,046,945 A | 4/2000 | Su et al. | 365/200 |
| 6,119,245 A * | 9/2000 | Hiratsuka | 714/7 |
| 6,172,935 B1 * | 1/2001 | Wright et al. | 365/233 |

OTHER PUBLICATIONS

"Double Data Rate (DDR) SDRAM", Publication No. JED-DDRDS.pm65, Rev. 0.9, 1999.

* cited by examiner

*Primary Examiner*—Son Mai

(57) ABSTRACT

A memory device responsive to command signals includes multiple banks of memory arrays. Each bank includes a plurality of primary storage cells and a spare unit of spare storage cells. A detector detects an error in a first unit of the primary storage cells in a first one of the banks. A controller responsive to command signals automatically re-maps the first unit of the primary storage cells to the spare unit of storage cells, without interrupting access to memory data.

28 Claims, 8 Drawing Sheets

| NAME (FUNCTION) | /CS | /RAS | /CAS | /WE | ADDR |
|---|---|---|---|---|---|
| DESELECT (NOP) | H | X | X | X | X |
| NO OPERATION (NOP) | L | H | H | H | X |
| ACTIVE (Select bank and activate row) | L | L | H | H | Bank/Row |
| READ (Select bank and column, and start READ burst) | L | H | L | H | Bank/Col |
| WRITE (Select bank and column, and start WRITE burst) | L | H | L | L | Bank/Col |
| BURST TERMINATE | L | H | H | L | X |
| PRECHARGE (Deactivate row in bank or banks) | L | L | H | L | Code |
| AUTO REFRESH or SELF REFRESH (Enter self refresh mode) | L | L | L | H | X |
| MODE REGISTER SET | L | L | L | L | Op-Code |

Fig. 5

SELF-HEALING MEMORY

THE FIELD OF THE INVENTION

The present invention generally relates to memory systems, and more particularly to a memory with self-healing capability.

BACKGROUND OF THE INVENTION

The size of available server memory systems is constantly increasing with time, with current server memory systems often being in the range of 64 Gbytes or larger. As the size of memory systems increases, and memory cell sizes get smaller, the probability of a memory bit failing, and thus the memory system failing, increases. Memory system failures can be the result of both temporary and permanent errors. Temporary errors are typically due to alpha particles. Permanent errors are typically the result of a memory cell wall failure, or to a much smaller degree a row or column decoder failure, a state machine failure or other catastrophic failures such as the failure of the mechanical interface between the dual in-line memory module (DIMM) printed circuit board and the system printed circuit board.

A problem with prior art memory configurations is related to the I/O pin count on the memory I/O controller. With increasingly demanding memory storage requirements, the number of memory modules connected to the memory controller is increasing. In a serial architecture configuration, increasing the number of memory channels by one increases the number of memory channels directly connected to the memory controller by one. This is problematic, since each additional memory channel requires additional input pins, increasing the system pin count, and increasing the probability of failure. This is especially problematic in memory storage systems having a large memory capacity. In addition, the additional memory bus loading from additional modules limits the memory system bus speed.

In order to prevent memory system failures, different forms of memory detection and correction processes have evolved. One commonly used system involves the use of parity bits to detect errors. When data is received, the parity of the data is checked against an expected value. When the data does not match the expected parity value (odd or even), an error is determined to have occurred. Although this method works for determining single bit errors, it does not always work well for determining multiple bit errors. Further, the simplest parity systems have no mechanism for correcting data errors.

One commonly used error detection and correction process uses error correcting or error checking and correction codes (ECC). ECC is typically based on CRC (cyclic redundancy checksum or cyclic redundancy code) algorithms. ECC codes can be used to restore the original data if an error occurs that is not too disastrous. With CRC algorithms, when data is received, the complete data sequence (which includes CRC bits appended to the end of the data field) is read by a CRC checker. The complete data sequence should be exactly divisible by a CRC polynomial. If the complete data sequence is not divisible by a CRC polynomial, an error is deemed to have occurred.

Unlike conventional error correction processes based on parity, systems based on ECC codes can typically be used to detect multiple bit errors. For example, an ECC memory system that has single bit correction typically can detect double bit errors and correct single bit errors. An ECC memory with 4 or 8 bit error correction can typically detect and correct 4 bit or 8 bit errors, respectively. Therefore, the failure of an entire Synchronous Dynamic Random Access Memory (SDRAM) chip organized in a x4 or x8 configuration will not cause the system to fail. Although ECC systems easily provide multiple bit error detection, a problem with conventional ECC systems is that they typically cause the system to halt when they report an uncorrectable error. Thus, a failed part in an ECC memory system cannot be replaced to restore the system failure immunity without first halting.

ECC and parity processes are commonly used in computer systems that rely on semiconductor memory where 24 hour a day, 7 day a week operation is required. Where computer systems do not require the speed required by semiconductor memory or alternatively where larger storage cannot be provided cost effectively by semiconductor memory, disk drive memory may be used. Computer systems supported by disk drive memory typically link together a plurality of disk drives through hardware to form a drive array known as a redundant array of inexpensive disks (RAID). The drives in the array are coordinated with each other and data is specially allocated between them. Because disk drives and the mechanical interfaces for disk drives are less reliable than semiconductor memory, the processes for data recovery due to permanent or temporary data failure for disk drive systems typically provide more redundancies and more complex data recovery methodologies.

Traditionally in a RAID system, data is split between the drives at the bit or byte level. For example, in a four drive system, two bits of every byte might come from the first hard disk, while the next two bits come from the second hard disk, and so on. The four drives then output a single byte data stream four times faster than a serial drive implementation, because transferring all of the information in a byte takes only as long as required for a single drive to transfer two bits. This technique of splitting data between several drives is referred to as data striping, and the actual block size per drive can be as high as 1000 bytes. The RAID memory implementation offers improved reliability and greater resistance to errors than can be achieved by operating each disk independently. The increased reliability and fault-tolerance is achieved through various redundancy measures, including mirroring and parity implementations.

The parity and ECC techniques discussed above are unable to correct "hard" or permanent errors in memories. In previous memory repair schemes, repairs have typically been done off-line with laser fuses. The repairs typically occur in DRAM manufacturing, and not after the memory is sent to the end customer.

It would be desirable to provide an on-line self-healing memory, without the disadvantages found in existing memory schemes, and without the requirement to add additional memory modules for spare memory.

SUMMARY OF THE INVENTION

The present invention provides a self-healing memory device responsive to command signals. The memory device includes multiple banks of memory arrays. Each bank includes a plurality of primary storage cells and a spare unit of spare storage cells. A detector detects an error in a first unit of the primary storage cells in a first one of the banks. A controller responsive to command signals automatically re-maps the first unit of the primary storage cells to the spare unit of storage cells.

In one embodiment, the self-healing memory provides on-line self-healing for memory hard bit errors. The memory bit functionality can be restored without shutting off power or swapping memory modules. By using an efficient error correcting code (ECC) scheme with the self-healing memory of the present invention, significant immunity from both hard and soft errors can be obtained. In one embodiment, the self-healing memory scheme is scalable, so that as memory sizes increase, the number of hot spare rows can increase. Because the additional spare memory row is small in comparison to the total number of the rows in a memory bank, the die area and cost impact is negligible.

In one embodiment, the self-healing memory is used in servers requiring 24 hour a day, 7 day a week on-line operation, to improve the reliability of such servers. The self-healing memory may also be used in cost sensitive PCs or workstations to avoid expensive service calls and unnecessary warranty costs. The self-healing technique can also be used for non-DRAM memory, and for CPU caches where on-line correction of hard bit errors is needed.

BRIEF DESCRIPTION OF THE DRAWINGS

FIG. 5 illustrates a truth table identifying commands that can be issued by the DDR SDRAM shown in FIG. 3.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
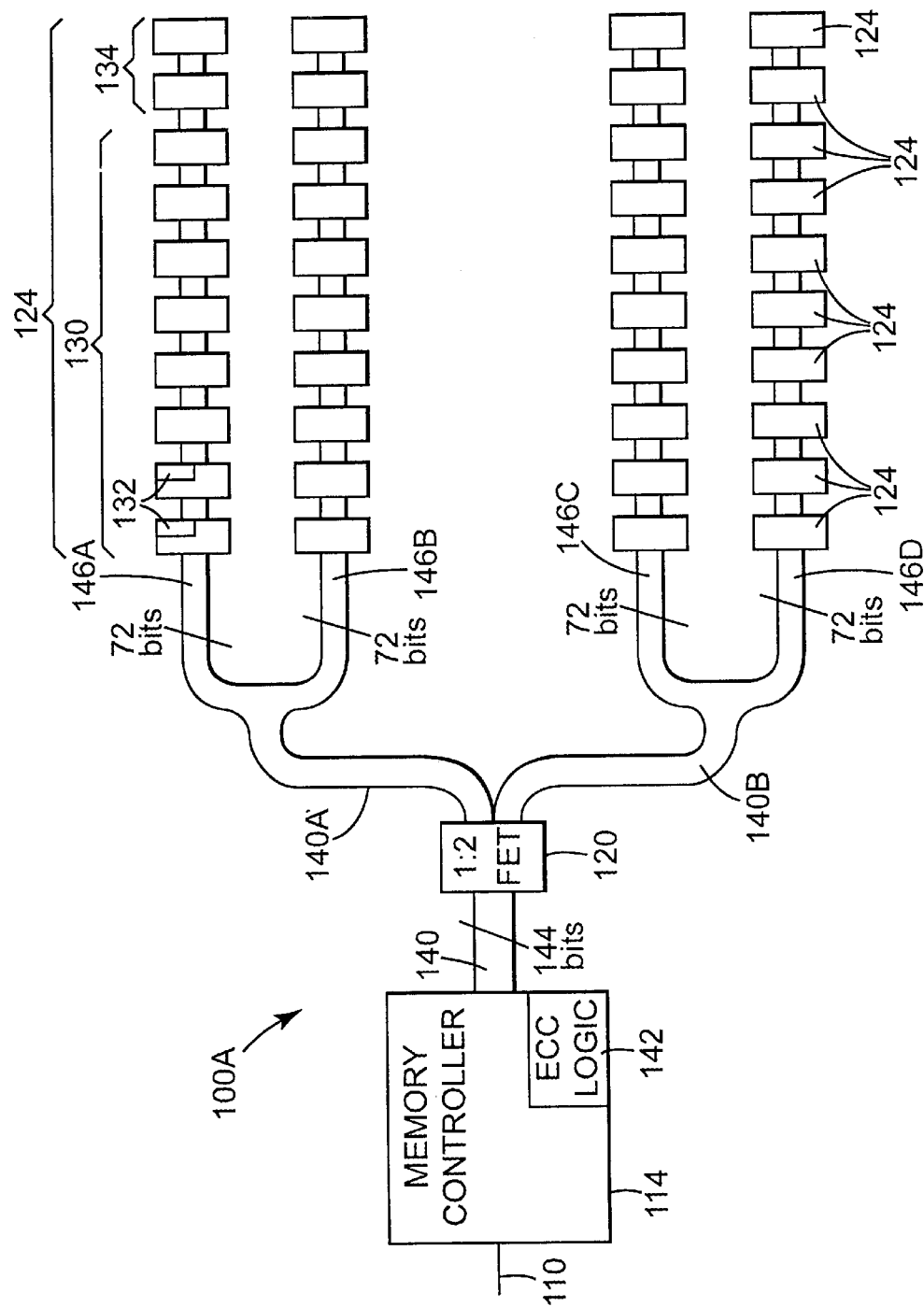
FIG. 1A illustrates a partial block diagram of a first embodiment of a self-healing memory system according to the present invention.

FIG. 1A shows a partial block diagram of a self-healing memory configuration 100A according to the present invention. In the preferred embodiment, the memory configuration 100A includes CPU bus 110 electrically coupled to a memory controller 114, the memory controller 114 electrically coupled to switch 120, wherein switch 120 is electrically connected to a plurality of memory modules 124. The plurality of memory modules 124 preferably includes a plurality of data memory modules 130 and a plurality of ECC memory modules 134. In one embodiment the data memory modules 130 and ECC memory modules 134 are connected in parallel. Memory modules 124 may also include one or more spare memory modules.

In one embodiment, each memory module 124 includes a non-volatile memory unit 132. Non-volatile memory unit 132 is preferably an EEPROM, although other types of non-volatile memories may be used.

In the embodiment shown in FIG. 1A, the data memory configuration is a self-healing double data rate (DDR) system with a 144 bit data memory channel 140, and 40 memory modules 124, preferably 32 DDR DIMMs for data 130 and 8 DIMMs for ECC 124. The 144 bit wide channel 140 includes 128 data bits and 16 ECC bits. The 144 bit data bus 140 is split into four separate 72 bit bus channels 146A–146D (collectively referred to as bus channels 146). Each bus channel 146, preferably includes eight memory modules 130 used for data and two memory modules 134 used for ECC.

Data bus 140 is electrically coupled to at least one switch 120, preferably a 1:2 FET, which is electrically coupled to CPU bus 110 via memory controller 114. In an alternative embodiment, switch 120 could be a crossbar-type switch. Switch 120 splits the 144 bit bus 140 into two 144 bit bus segments 140A and 140B. Switch 120 divides the signals from the memory bus 140 to reduce the loading on memory controller 114. Depending on the system requirements, and in particular the number of memory modules 124 in the memory configuration, a 1:2 or 1:4 FET could be used. The increased size ratio of the FET switch means that the number of bus segments 140A–140B is increased.

For 72 bit wide DRAMs, each of the two 144 bit bus segments 140A and 140B is divided into two separate 72 bit bus channels 146A–146D. Each of the 72 bit memory channels 146A–146D is connected in parallel to ten 72 bit memory modules 124.

Memory configuration 100A includes two ECC memory modules 134 for each memory channel 146. However, the preferred number of ECC modules 134 depends on multiple factors, including but not limited to the type of CRC polynomial used, the number of data errors and number of channels upon which data errors will be corrected. Memory controller 114 includes ECC logic 142, which provides data correction for memory errors. ECC logic 142 uses conventional techniques that may vary dependent upon the data correction requirements and algorithms used.

Memory configuration 100A shown in FIG. 1A is not easily scalable if striping is used. Although the configuration and number of modules 124 shown in FIG. 1A is a typical for a high-end system, the number of modules 124 connected to data bus 140 may be as low as a single memory module 124 used for data storage. If a single memory module 124 is used for data storage, the memory module 124 should have at least one memory device or bits of a memory device that are dedicated to error correction.

Figure 1B:
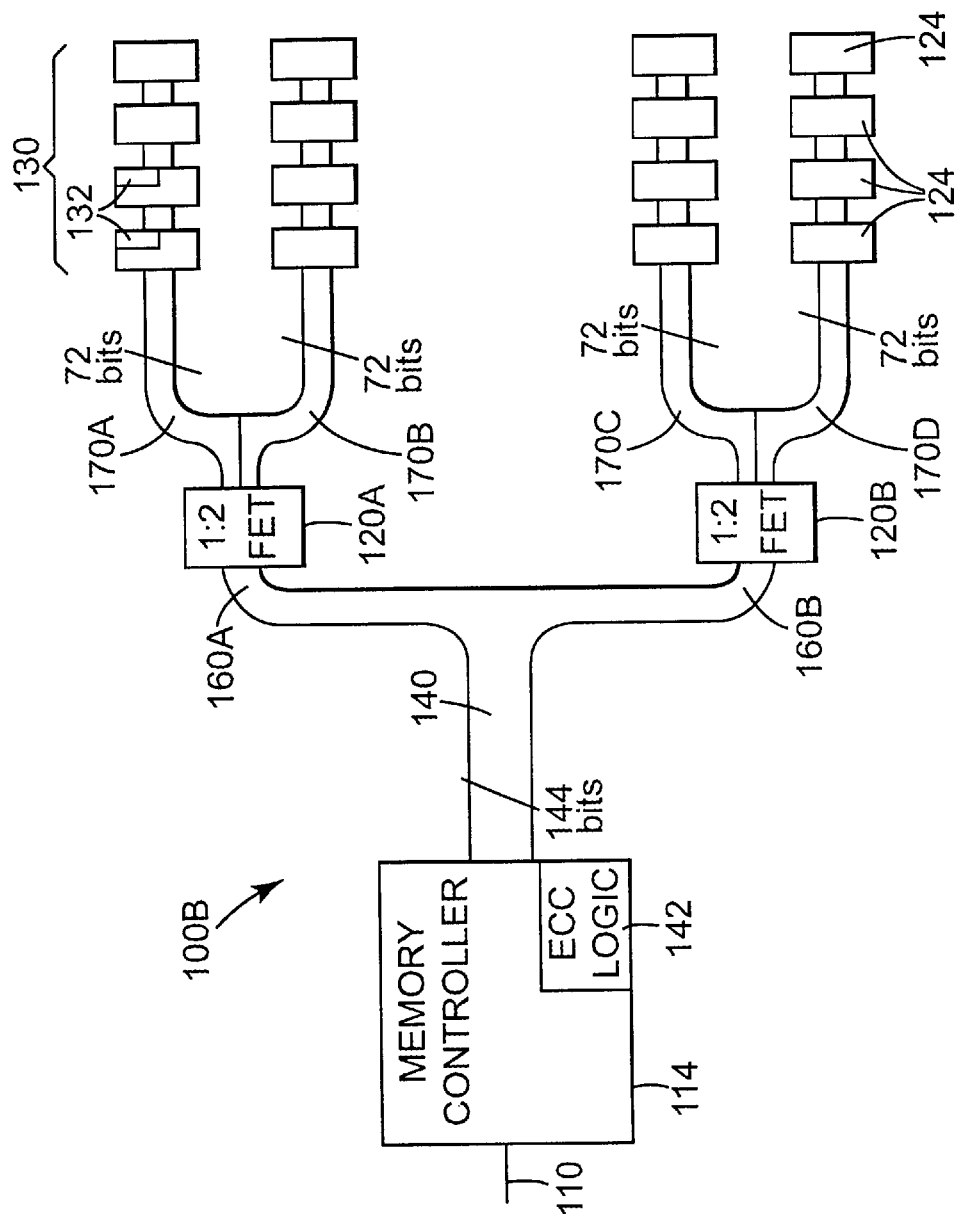
FIG. 1B illustrates a partial block diagram of a second embodiment of a self-healing memory system according to the present invention.

FIG. 1B shows a partial block diagram of second preferred embodiment of a self-healing memory configuration 100B according to the present invention. Embodiment 100B shown in FIG. 1B is a scaled down version of embodiment 100A shown in FIG. 1A. Memory configuration 100B includes a plurality of memory modules 124 that can be used for storing either data or ECC. The 144 bit wide bus 140 includes 128 data bits and 16 ECC bits. In contrast to the embodiment shown in FIG. 1A, there are no dedicated ECC devices in embodiment 100B. Rather, bits on the memory devices may be dedicated to data or ECC. Again, one or more spare memory modules may be provided for each 72 bit bus 170A–170D. In embodiment 100B, data striping is not used and the system is therefore very scalable. Embodiment 100B requires a minimum of two data memory modules 124.

In embodiment 100B, the data memory channel 140 electrically couples memory controller 114 to switches 120A and 120B, preferably each being a FET switch. In one embodiment, switches 120A and 120B are each a 1:2 FET switch. For embodiment 100B, a switch 120A and 120B is used for each 144 bit bus 160A and 160B. In an alternative embodiment, no switch is used. Typically, a switch is not included as part of the memory configuration for small memory systems (e.g., in the 1 GB range), where only a small number of memory modules are needed.

In embodiments 100A and 100B, memory modules 124 are preferably DIMMs with 72 bit wide DDR SDRAMS. However, any type of read/write memory components may be used as long as they meet system requirements.

A DDR SDRAM typically includes multiple banks or arrays of memory, divided into a plurality of rows of storage units. A self-healing memory according the present invention provides a mechanism to dynamically change the mapping from a bad row to a spare row via a command in the DDR SDRAM command set. When a hard error is detected, a command is issued that allows the SDRAM memory bank row address with the hard error to be re-mapped to the spare row in that bank inside the SDRAM.

Figure 2A:
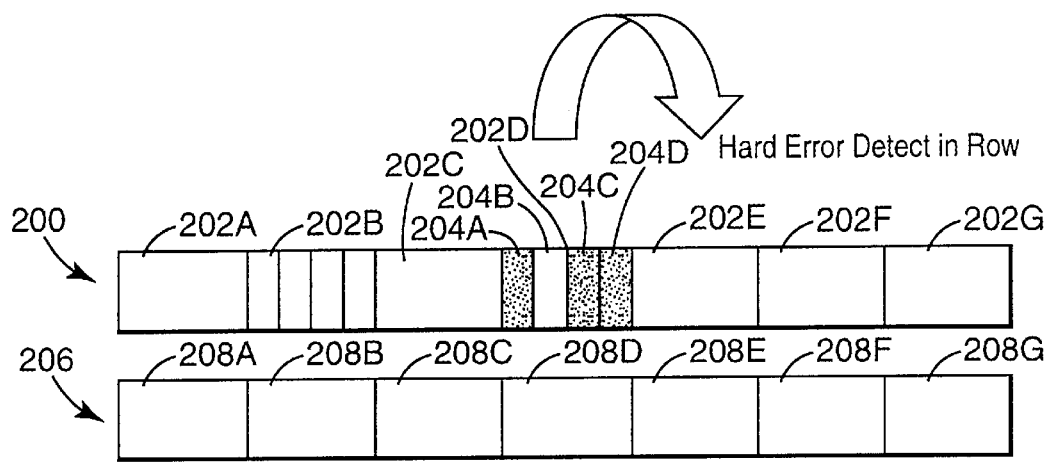
FIGS. 2A–2C illustrates a first memory row and a spare memory row and the mapping of the first memory row to the spare memory row according to the present invention.
Figure 2B:
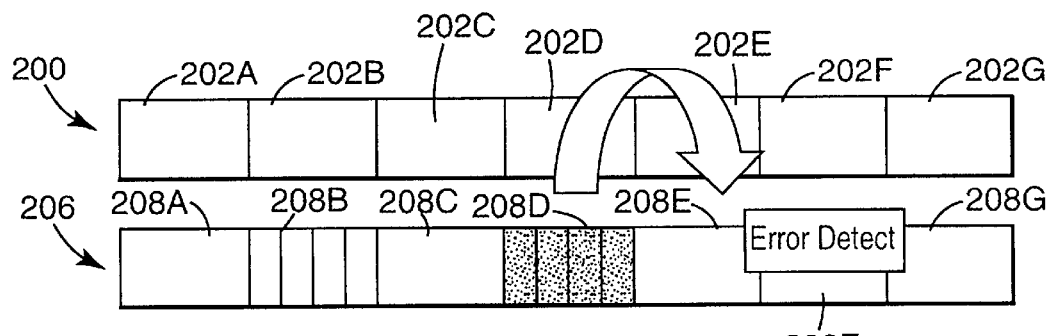
Figure 2C:
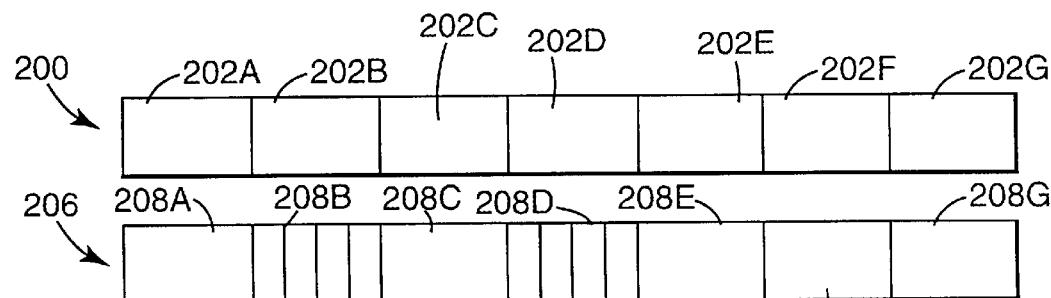

FIGS. 2A–2C illustrate a first memory row 200 and a spare memory row 206, and the mapping of first memory row 200 to the spare memory row 206 according to the present invention. Row 200 includes nibbles 202A–202G. Spare row 206 includes nibbles 208A–208G. Nibble 202D of row 200 includes 4 bits 204A–204D. Nibble 202D includes a hard error at bit 204B. When hard error at bit 204B is detected, a self-heal operation according to the present invention is initiated, and row 200 is re-mapped to spare row 206 as described below. The system identifies an error as a "hard" error if the same error repeats at the same address on subsequent reads. In one embodiment, when a hard error is detected in row 200, row 200 is "locked" to spare memory row 206. Row 200 is locked to spare memory row 206 by setting the LR bit in the extended mode register (discussed below) to "1."

FIG. 2B shows row 200 and spare row 206 after row 200 is locked to spare row 206. After rows 200 and 206 are locked, errors detected and corrected are written back to both rows 200 and 206. System writes and refreshes occur on both rows 200 and 206, but read operations occur only on row 200. As shown in FIG. 2B, an error is detected in nibble 208D of spare row 206. The error is corrected using conventional ECC techniques.

In one embodiment, row 200 is not re-mapped to spare row 206 until the entire spare row 206 is "scrubbed." "Scrubbing" means systematically performing a read operation of a nibble, followed by correction of the data that is read, followed by a write operation of the corrected data, for each nibble in spare row 206, so that the data in spare row 206 is identical to the data in row 200. After spare row 206 is scrubbed, row 200 is mapped to spare row 206 by setting the LR bit back to "0", and setting the HSR bit in the extended mode register (discussed below) to "1". FIG. 2C illustrates row 200 and spare row 206 after the re-mapping. After the re-mapping, the memory bit functionality has been restored, and all operations (e.g., READ and WRITE operations) directed to row 200 will automatically be re-directed to spare row 206.

Figure 3:
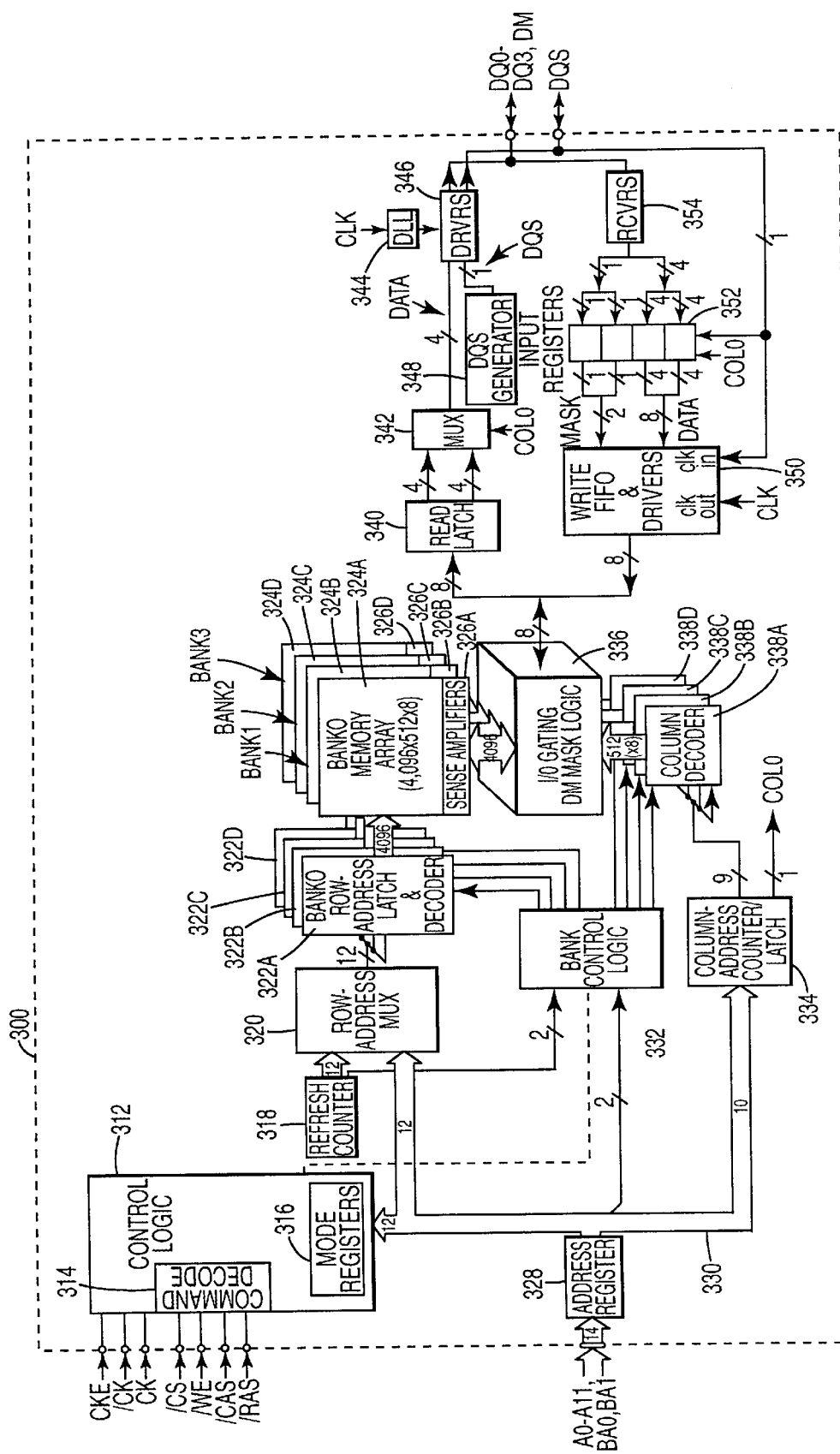
FIG. 3 illustrates a double data rate (DDR) synchronous dynamic random access memory (SDRAM) according to the present invention.

FIG. 3 shows a block diagram of a double data rate (DDR) synchronous dynamic random access memory (SDRAM) according to the present invention. DDR SDRAM 300 includes controller 312, command decoder 314, mode registers 316, refresh counter 318, row address multiplexer 320, row address latches and decoders 322A–322D (collectively referred to as row address latches an decoders 322), memory banks 324A–324D (collectively referred to as memory banks 324), sense amplifiers 326A–326D (collectively referred to as sense amplifiers 326), address register 328, address bus 330, bank controller 332, column address counter/latch 334, I/O gating and mask controller 336, column decoders 338A–338D (collectively referred to as column decoders 338), read latch 340, multiplexer 342, DLL 344, drivers 346, DQS generator 348, write FIFO and drivers 350, input registers 352, and receivers 354. The double data rate architecture of DDR SDRAM 300 provides two data transfers per clock cycle. DDR SDRAM 300 is in a "×4" configuration (i.e., includes four input/output lines DQ0–DQ3). Other configurations may also be used, including ×8 and ×16 configurations.

In one embodiment, DDR SDRAM 300 is JEDEC compliant. The 64 Mb JEDEC specification entitled "Double Data Rate (DDR) SDRAM", Pub. No. JEDDDRDS.pm65, Rev. 0.9, 1999, is hereby incorporated by reference.

Controller 312 includes the following inputs: CKE, /CK, CK, /CS, /WE, /CAS, and /RAS. CKE is a clock enable input. DDR SDRAM 300 operates from a differential clock (CK and /CK). The crossing of CK going high and /CK going low is referred to as the positive edge of CK. Commands (address and control signals) are registered at every positive edge of CK. Input data is registered on both edges of DQS, and output data is referenced to both edges of DQS, as well as to both edges of CK. /CS is a chip select input. /WE (write enable), /CAS (column address strobe), and /RAS (row address strobe) are command inputs that define a command being entered.

Fourteen input lines A0–A11 and BA0–BA1 are coupled to address register 328. Address register 328 is coupled to address bus 330. Address register 328 couples lines A0–A11 and BA0–BA1 to controller 312 and row address multiplexer 320. Address register 328 couples lines BA0–BA1 to bank controller 332. Address register 328 couples lines A0–A9 to column address counter/latch 334.

BA0 and BA1 are bank address inputs. BA0 and BA1 identify the bank 324A–324D to which an ACTIVE, READ, or WRITE command are being applied. Bank controller 332 is coupled to row address latches and decoders 322, and to column decoders 338. Bank controller 332 enables selected ones of row address latches and decoders 322 and column decoders 338 based on the values on lines BA0 and BA1. A0–A11 are address inputs, which provide the row address for ACTIVE commands, and the column address for READ/WRITE commands, to select one location out of the memory array in the selected bank 324A–324D. A row address provided to row address multiplexer 320 from address bus 330 is output by multiplexer 320 to each of the row address latches and decoders 322. During REFRESH commands (discussed below), row addresses are provided to row address multiplexer 320 from refresh counter 318. Row addresses are latched by row address latches and decoders 322. Column addresses are latched by column address counters/latches 334.

Address inputs A0–A11 also provide the op-code during a MODE REGISTER SET command. The op-codes are provided to controller 312 via address bus 330. BA0 and BA1 define which mode register is loaded during the MODE REGISTER SET command (i.e., the mode register or the extended mode register).

DDR SDRAM also includes five bi-directional input/output lines—DQ0–DQ3 and DQS, and one unidirectional line DM (input only). DQ0–DQ3 are used for the input/output of data. DQ0–DQ3 and DM are coupled to drivers 346 and receivers 354. Signals that are input to DDR SDRAM 300 on lines DQ0–DQ3 and DM are received and amplified by receivers 354, pass through input registers 352 and write FIFO and drivers 350, and are ultimately received by I/O gating and mask logic controller 336. DQS is coupled to drivers 346, input registers 352, and write FIFO and drivers 350. DQS is an input/output data strobe (i.e., output with read data, and input with write data). DQS is edge-aligned with read data, and center-aligned for write data. DQS is used to capture write data. DQS is transmitted/received with data, and is used in capturing write data at input registers 352. DQS is transmitted by DQS generator 348 during READ operations, and by memory controller 114 during WRITE operations. DM is an input mask signal for write data. Input data is masked by I/O gating and mask controller 336 when DM is sampled high along with that input data during a WRITE access.

Figure 4:
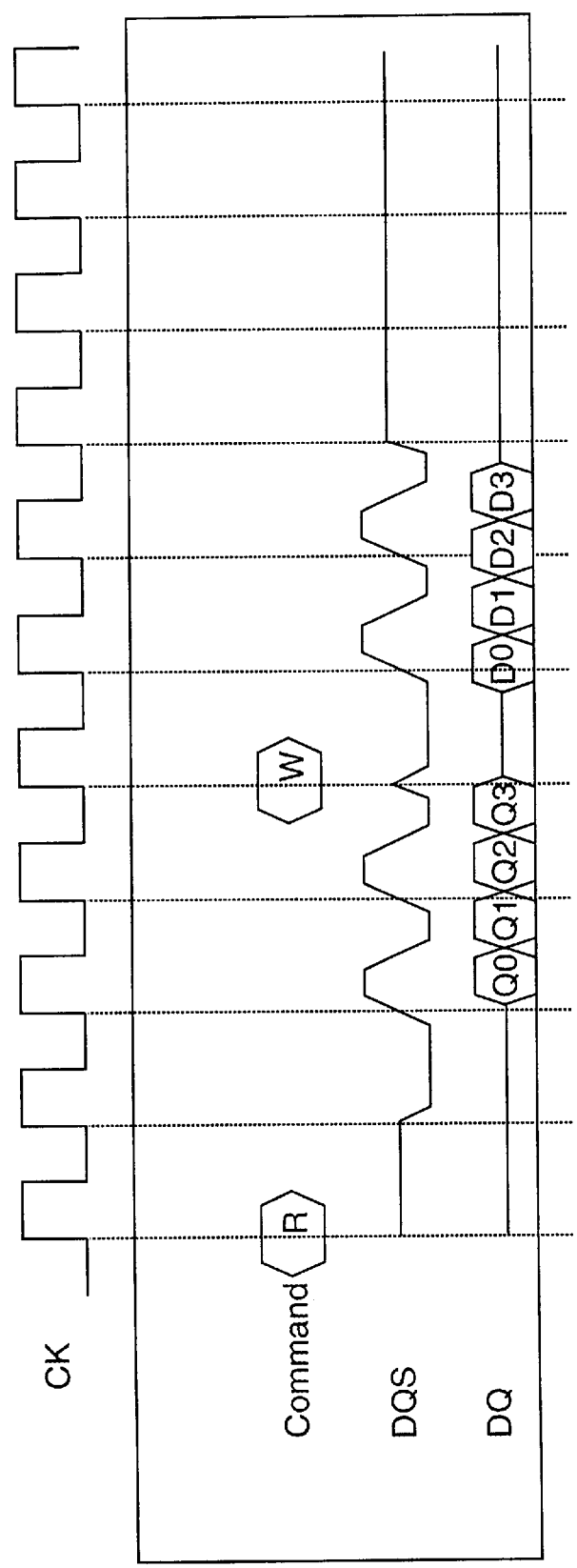
FIG. 4 illustrates a timing diagram showing the timing for read and write operations of the DDR SDRAM shown in FIG. 3.

FIG. 4 illustrates a timing diagram showing the timing for READ and WRITE operations of the DDR SDRAM shown in FIG. 3. As shown in FIG. 4, a READ command (R) is registered at the positive edge of CK in the first clock cycle. At the positive edge of CK in the third clock cycle, the reading of data begins. The DQS signal is edge-aligned with each of the data elements (Q0–Q3). At the positive edge of CK in the fifth clock cycle, a WRITE command (W) is registered. Just before the positive edge of CK in the sixth clock cycle, the writing of data begins. The DQS signal is center-aligned with each of the data elements (D0–D3).

FIG. 5 illustrates a truth table identifying commands that can be issued to the DDR SDRAM 300 shown in FIG. 3. As shown in FIG. 5, for a DESELECT command, /CS is set high. For a NO OPERATION command, /CS is set low, /RAS is set high, /CAS is set high, and /WE is set high. For an ACTIVE command, /CS is set low, /RAS is set low, /CAS is set high, and /WE is set high. The address registered with an ACTIVE command identifies a bank and row address. For a READ command, /CS is set low, /RAS is set high, /CAS is set low, and /WE is set high. The address registered with a READ command identifies a bank and column address. For a WRITE command, /CS is set low, /RAS is set high, /CAS is set low, and /WE is set low. The address registered with a WRITE command identifies a bank and column address. For a BURST TERMINATE command, /CS is set low, /RAS is set high, /CAS is set high, and /WE is set low. For a PRECHARGE command, /CS is set low, /RAS is set low, /CAS is set high, and /WE is set low. For an AUTO REFRESH or SELF REFRESH command, /CS is set low, /RAS is set low, /CAS is set low, and /WE is set high. For a MODE REGISTER SET command, /CS is set low, /RAS is set low, /CAS is set low, and /WE is set low.

The DESELECT command prevents new commands from being executed by DDR SDRAM 300. DDR SDRAM 300 is effectively deselected. Operations already in progress are not affected by a DESELECT command.

The NO OPERATION (NOP) command is used to perform a NOP to a DDR SDRAM 300 that is selected (/CS is low). This prevents unwanted commands from being registered during idle or wait states. Operations already in progress are not affected.

The ACTIVE command is used to open (or activate) a row in a particular bank for a subsequent access. The value on the BA0 and BA1 inputs identifies the bank, and the address provided on inputs A0–A11 selects the row. The selected row remains active (or open) for accesses until a PRECHARGE (or READ or WRITE with AUTO PRECHARGE) is issued to that bank. A PRECHARGE (or READ or WRITE with AUTO PRECHARGE) command must be issued before opening a different row in the same bank. After opening a row (by issuing an ACTIVE command), a READ or WRITE command may be issued to that row. A subsequent ACTIVE command to a different row in the same bank can only be issued after the previous active row has been closed (e.g., with PRECHARGE). A subsequent ACTIVE command to another bank can be issued while the first bank is being accessed, which results in a reduction of total row-access overhead.

READ and WRITE accesses to DDR SDRAM 300 are burst oriented—accesses start at a selected location and continue for a programmed number of locations in a programmed sequence. The burst length is programmable. In one embodiment, DDR SDRAM 300 provides burst lengths of 2, 4, and 8 locations, for both a sequential and an interleaved burst type. The burst length determines the maximum number of column locations that can be accessed for a given READ or WRITE command. Column address counter/latch 334 is responsible for counting through the selected number of column locations in a burst, and providing the column locations to column decoders 338. Accesses begin with the registration of an ACTIVE command, which is then followed by a READ or WRITE command. The address bits on address bus 330 registered coincident with the ACTIVE command are used by bank controller 332 and row address latches and decoders 322 to select the bank and row, respectively, to be accessed. The address bits on address bus 330 registered coincident with the READ or WRITE command are used by column address counter/latch 334 and column decoders 338 to select the starting column location for the burst access.

When a READ or WRITE command is issued, a block of columns equal to the burst length is effectively selected. All accesses for that burst take place within this block, meaning that the burst will wrap within the block if a boundary is reached. The programmed burst length applies to both READ and WRITE bursts.

Accesses within a given burst may be programmed to be either sequential or interleaved. This is referred to as the burst type and is selected via bit A3 in one embodiment. The ordering of accesses within a burst is determined by the burst length, the burst type and the starting column address.

The read latency is the delay, in clock cycles, between the registration of a READ command and the availability of the first piece of output data. In one embodiment, the latency can be set to 2 or 2.5 clocks. In another embodiment, latencies of 1.5 and 3 are also available.

The READ command is used to initiate a burst read access to an active row. The starting column and bank addresses are provided with the READ command and AUTO PRECHARGE is either enabled or disabled for that burst access. The value on the BA0 and BA1 inputs selects the bank, and the address provided on inputs A0–A1 (where i=7 for ×16, 8 for ×8, and 9 for ×4 organization) selects the starting column location. The value on input A10 determines whether or not AUTO PRECHARGE is used. If AUTO PRECHARGE is selected, the row being accessed will be precharged at the end of the READ burst. If AUTO PRE-CHARGE is not selected, the row will remain open for subsequent accesses.

Sense amplifiers 326 and I/O gating and mask controller 336 operate in a manner known in the art to sense the data stored in the storage cells of banks 324 addressed by the active row and column. The data obtained during a READ operation is output from I/O gating and mask controller 336 to read latch 340, where the data is latched. I/O gating and mask controller 336 outputs the data to read latch 340 8 bits at a time. Read latch 340 outputs the received 8 bits to multiplexer 342 in two 4 bit segments. Multiplexer 342 outputs a first one of the 4 bit segments followed by the second 4 bit segment to drivers 346. Drivers 346 amplify the received data and output the amplified data on lines DQ0–DQ3. Drivers 346 also receive a DQS signal from DQS generator 348, and output an amplified DQS signal on the DQS line. DLL 344 is coupled to drivers 346 and receives a clock input. DLL 344 aligns transitions of DQ0–DQ3 and DQS with CK transitions.

During READ bursts, the valid data-out element from the starting column address will be available following a CAS latency after the READ command. Each subsequent data-out element will be valid nominally at the next positive or negative clock edge (i.e., at the next crossing of CK and /CK). DQS is driven by DQS generator 348 along with the output data. Data from any READ burst must be completed or truncated before a subsequent WRITE command can be issued. If truncation is necessary, the BURST TERMINATE command is used.

The WRITE command is used to initiate a burst write access to an active row. The starting column and bank addresses are provided with the WRITE command, and AUTO PRECHARGE is either enabled or disabled for that access. The value on the BA0 and BA1 inputs selects the bank, and the address provided on inputs A0–A1 (where i=7 for ×16, 8 for ×8, and 9 for ×4 organization) selects the starting column location. In one embodiment, the value on input A10 determines whether or not AUTO PRECHARGE is used. If AUTO PRECHARGE is selected, the row being accessed will be precharged at the end of the write burst. If AUTO PRECHARGE is not selected, the row will remain open for subsequent accesses. Input data appearing on the DQ0–DQ3 lines are written to a memory bank 324 subject to the DM input logic level appearing coincident with the data. If a given DM signal is registered low, the corresponding data will be written to memory by I/O gating and mask controller 336. If the DM signal is registered high, the corresponding data inputs will be ignored, and a WRITE will not be executed to that selected location. During write bursts, the first valid data-in element will be registered on the first rising edge of DQS following the WRITE command, and subsequent data elements will be registered on successive edges of DQS.

The PRECHARGE command is used to deactivate the open row in a particular bank or the open row in all banks. The bank(s) will be available for a subsequent row access a specified time after the PRECHARGE command is issued. Input A10 determines whether one or all banks are to be precharged, and in the case where only one bank is to be precharged, inputs BA0 and BA1 select the bank. Once a bank has been precharged, it is in the idle state and must be activated prior to any READ or WRITE commands being issued to that bank. A PRECHARGE command is treated as a NOP if there is no open row in that bank, or if the previously open row is already in the process of precharging.

AUTO PRECHARGE is a feature that performs the same individual bank precharge function described above, but without requiring an explicit command. AUTO PRE-CHARGE is accomplished by using A10 to enable AUTO PRECHARGE in conjunction with a specific READ or WRITE command. A precharge of the bank/row that is addressed with the READ or WRITE command is automatically performed upon completion of the READ or WRITE burst. AUTO PRECHARGE is nonpersistant in that it is either enabled or disabled for each individual READ or WRITE command.

The BURST TERMINATE command is used to truncate READ bursts (with AUTO PRECHARGE disabled).

The AUTO-REFRESH and SELF-REFRESH commands are used to refresh the contents of memory banks 324. Refresh counter 318 controls row addressing for REFRESH commands.

Figure 6:
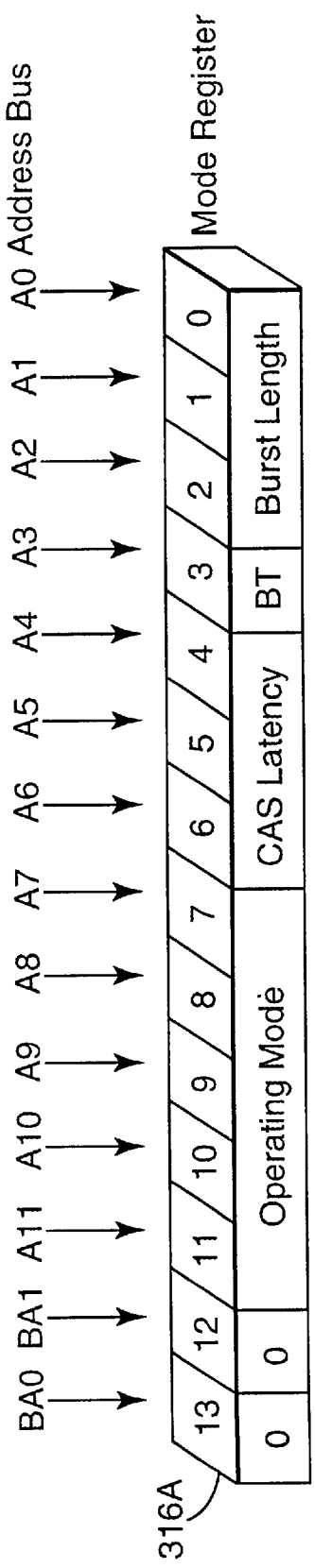
FIG. 6 illustrates a mode register of the DDR SDRAM shown in FIG. 3.
Figure 7:
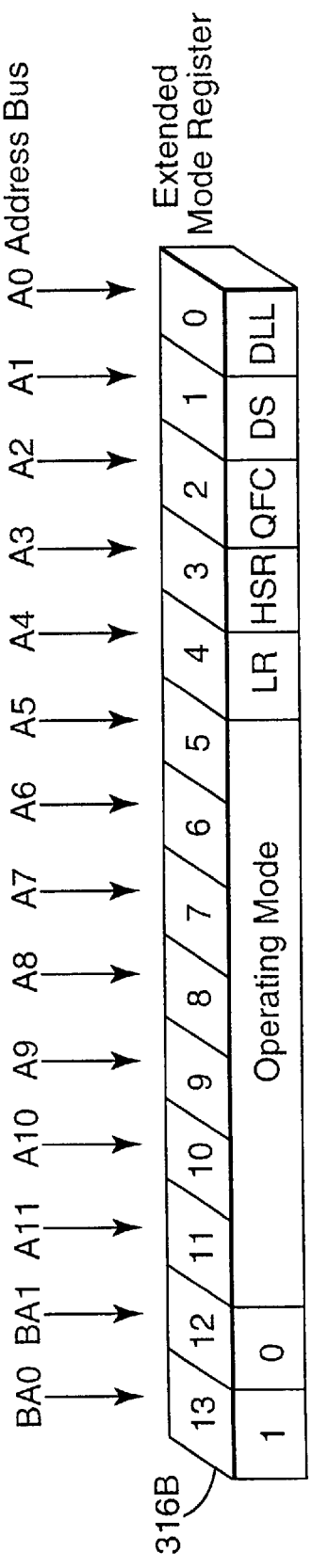
FIG. 7 illustrates an extended mode register of the DDR SDRAM shown in FIG. 3.

Mode registers 316 in controller 312 include mode register 316A (shown in FIG. 6) and extended mode register 316B (shown in FIG. 7). Mode registers 316 are used to define the specific mode of operation of DDR SDRAM 300. Mode register 316A is used to define a burst length, a burst type, a CAS latency, and an operation mode, as shown in FIG. 6. Mode register 316A is programmed with a MODE REGISTER SET command (with BA0=0 and BA1=0) and retains the stored information until it is programmed again, or the device 300 loses power. Mode register bits A0–A2 specify the burst length, bit A3 specifies the burst type (BT), either sequential or interleaved, bits A4–A6 specify the CAS latency, and bits A7–A11 specify the operating mode.

In one embodiment, a normal operating mode is selected by issuing a MODE REGISTER SET command with bits A7–A11 each set to zero, and bits A0–A6 set to the desired values. In one embodiment, A DLL reset is initiated by issuing a MODE REGISTER SET command with bits A7 and A9–A11 each set to zero, bit A8 set to one, and bits A0–A6 set to the desired values. A MODE REGISTER SET command issued to reset the DLL should be followed by a MODE REGISTER SET command to select normal operation mode. Other combinations of values for A7–A11 are used to select other modes, including test modes.

FIG. 7 shows a diagram of extended mode register 316B. Extended mode register 316B controls functions beyond those controlled by mode register 316, including DLL enable/disable (bit A0), drive strength (bit A1), QFC enable/disable (bit A2), and enablement of the self-healing function of the present invention. The DLL must be enabled for normal operation. DLL enable is required during power-up initialization, and upon return to normal operation after having disabled the DLL for the purpose of debug or evaluation.

Extended mode register 316B is programmed via the MODE REGISTER SET command (with BA0=1 and BA1=0), and retains the stored information until it is programmed again or until device 300 loses power. Bits A5–11 define an operating mode of device 300. Bit A3 is referred to as a hot spare row (HSR) bit, and is used to enable/disable the self-heal capability of the present invention. Setting bit A3 to zero results in normal operation. Setting bit A3 to one enables HSR mode or self-healing mode. Bit A4 is referred to as a Lock Row (LR) bit.

In one embodiment, one spare row of memory is provided for each bank 324A–324D. The spare row in each bank is referred to as a hot spare row, indicating that the row may be swapped with another row on-line, without shutting off power to device 300. For a 72 bit DDR stacked memory module with ×4 organization, if one hot spare row is provided per bank, a total of 144 spare rows are provided. 72 hot spare rows are provided for the same DIMM using ×8 organization. In memory modules, for example, with 36 DRAMs each having four internal banks 324A–324D, the number of hard errors that can be healed per module, assuming random hard error distribution, is 144. Therefore, for all practical purposes memory modules never need to be replaced due to hard bit failures.

144 spare rows in the ×4 configuration are available if the rows in each ×4 bit DRAM are independent. If the rows are treated as dependent (i.e., all addressed at the same time), there are 8 hot spare rows available for each 72 bit DIMM (4 banks per DRAM X 2 rows of memory per DIMM) in a 144 bit wide memory system.

When the HSR bit is set, an ACTIVATE command functions as a HEAL command, and the memory row address with the hard error is re-mapped to the hot spare row. In one embodiment, when the HEAL command is received, the row address latch and decoder 322 for the specified bank re-maps the row address with the hard error (specified by the address registered with the HEAL command) to the hot spare row address. When the HSR bit is set, any operation to the row address that was healed now references the hot spare row. In addition, when the HSR bit is set, a DEACTIVATE command (or PRECHARGE command) functions as an UNHEAL command, which causes the reverse to happen. The UNHEAL command allows the hot spare row address to be re-mapped back to the address of the disabled row in each memory bank. As in the standard ACTIVATE and DEACTIVATE commands, the A10 bit defines whether the HEAL or UNHEAL command applies to one bank specified by bits BA0–BA1, or all banks at the same time.

In one embodiment, when the LR bit is set high and the HSR bit is low, any operation to the row address re-mapped to the hot spare row occurs on both rows of memory, except that a READ operation is normal and only references the row that has been re-mapped to the hot spare row. Also, when the received row address equals the address of the hot spare row, the normal bank row address and the row address of the hot spare row are selected at the same time.

In one embodiment, memory configurations 100A and 100B include an ECC scheme that is used for burst error detection, allowing for correction of at least single bit errors after single bit or 4-bit nibble errors have occurred. The ECC scheme preferably provides correction for 1 bit soft errors during the scrubbing operation (discussed above with respect to FIGS. 2A–2C), after a 1 bit, or a 4-bit nibble, hard error has occurred.

When a hard error is detected (and also corrected), the LR bit for that physical row of memory is enabled and the row address is stored in one of the latches and decoders 322. Subsequently, WRITE operations go to both the hot spare row and the row with the hard error. REFRESH operations operate on both rows, and READ operations only operate on the row with the hard error. The row of memory is scrubbed to ensure that the entire hot spare row has corrected, as well as current data.

In one embodiment, heal status information for device 300 is stored in the non-volatile memory 132 for the memory module 124 containing that device 300. The heal status information identifies the device 300, bank 324, and the row containing the hard error. Other related information may also be stored in non-volatile memory 132, such as the nibble or bit within the row containing the hard error. After each system power up, each SDRAM 300 in each memory module 124 is initialized by memory controller 114, based on the heal status information stored in non-volatile memory 132.

Figure 8:
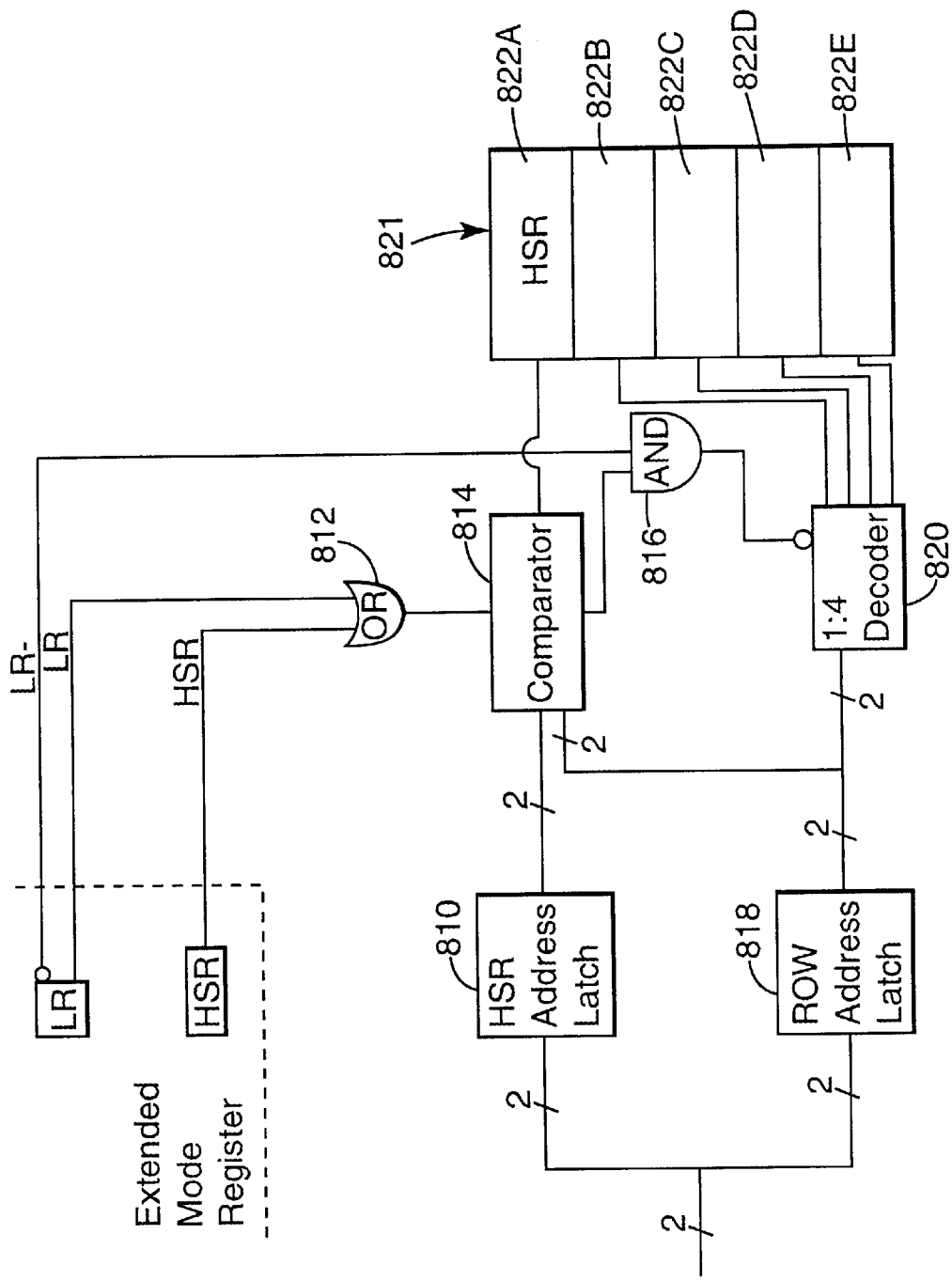
FIG. 8 illustrates a partial block diagram of one embodiment of a latch and decoder circuit for implementing the self-healing capability of the present invention.

FIG. 8 shows a partial block diagram of a simplified embodiment of one of row address latches and decoders 322. For ease of illustration and explanation, FIG. 8 shows a memory bank 821 with only four rows 822B–822E and one hot spare row 822A. It will be understood by one of ordinary skill in the art that the techniques discussed with reference to FIG. 8 can be extended to handle larger addresses and additional rows. The diagram illustrates HSR address latch 810, OR gate 812, comparator 814, AND gate 816, row address latch 818, decoder 820, and bank 821. In the embodiment shown, decoder 820 is a 1:4 decoder. FIG. 8 also shows a portion of extended mode register 316B, including an LR bit, and an HSR bit. Each of these bits is cleared at power-on of device 300.

The LR bit includes two outputs—an LR output coupled to one input of OR gate 812, and an inverted output LR−coupled to one input of AND gate 816. The HSR bit has one HSR output coupled to an input of OR gate 812.

As a first example, if the HSR bit is high and the LR bit is low, the output of OR gate 812 is high, which enables comparator 814. A 2 bit row address is received and latched by latches 810 and 818. The same latched row address is output by latches 810 and 818 to comparator 814. Comparator 814 compares the two addresses, and outputs a high signal (because the addresses output by latches 810 and 818 are the same) to hot spare row 822A, thereby enabling the hot spare row. The high signal from comparator 814 also goes to an input of AND gate 816. The other input of AND gate 816 is coupled to the LR−output of the LR bit. Since the LR bit is low in this example, LR−is high, making both inputs to AND gate 816 high. AND gate 816, therefore, outputs a high signal to decoder 820. The high signal to decoder 820 is inverted at the input of decoder 820, thereby generating a low signal that disables decoder 820. Therefore, when the HSR bit is set high and the LR bit is set low, hot spare row 822A is selected, and all other rows 822B–822E are deselected.

As a second example, when the LR bit is set high and the HSR bit is set low, OR gate 812 outputs a high signal due to the high signal at its input from the LR output line. AND gate 816 outputs a low signal due to the low signal at its input from the LR−line. The high signal from OR gate 812 enables comparator 814. Again, because both of the input addresses to comparator 814 are the same, comparator 814 outputs a high signal to hot spare row 822A, thereby selecting hot spare row 822A. Because the LR−input to AND gate 816 is low, AND gate 816 outputs a low signal to decoder 820. The low signal to decoder 820 is inverted at the input of decoder 820, thereby generating a high signal that enables decoder 820. Decoder 820 decodes the address from latch 818, and selects the row 822B–822E corresponding to the input address. Therefore, when the LR bit is set high and the HSR bit is set low, both the normal bank row address and the HSR row address are selected at the same time.

Although the present invention has been discussed with respect to a hot spare row, the self-healing technique of the present invention can be applied to hot spare columns or any discrete block of addressable memory cells that have a hard error, where a hot spare discrete block of memory cells of the same organization is provided. Further, the self-healing memory techniques described herein with reference to a DDR SDRAM also apply to SRD SDRAMs, as well as RAMBUS memories. The self-healing memory scheme also applies to ADT memory technologies.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A self-healing volatile memory device responsive to command signals, the memory device comprising:
   multiple banks of memory arrays, each bank including a plurality of primary storage cells and a spare unit of spare storage cells;
   a detector for detecting an error in a first unit of the primary storage cells in a first one of the banks with no user intervention; and
   a controller responsive to command signals for automatically re-mapping the first unit of the primary storage cells to the spare unit of storage cells based on the detected error.

2. The memory device of claim 1, and further comprising a mode register for storing mode information, and wherein the controller performs the remapping based on the mode information.

3. The memory device of claim 2, wherein the mode register is programmable.

4. The memory device of claim 1, wherein the memory device is a synchronous dynamic random access memory.

5. The memory device of claim 4, wherein the memory device is a double data rate synchronous dynamic random access memory.

6. The memory device of claim 1, wherein the memory arrays are organized into a plurality of rows and a plurality of columns, and wherein the spare unit of spare storage cells is a spare row of storage cells.

7. The memory device of claim 3, wherein the mode register includes a control bit, and wherein the controller performs the re-mapping when the controller receives an activate command if the control bit is set, and does not perform the re-mapping if the control bit is not set.

8. The memory device of claim 1, and further comprising a non-volatile memory for storing status information regarding the re-mapping.

9. The memory device of claim 8, wherein the status information comprises a first address identifying the first unit of primary storage cells and a second address identifying the first bank.

10. The memory device of claim 9, wherein the status information further comprises a third address identifying the spare unit of spare storage cells.

11. The memory device of claim 8, wherein the non-volatile memory is an EEPROM.

12. The memory device of claim 1, wherein the controller is responsive to command signals for re-mapping the spare unit of storage cells to the first unit of the primary storage cells.

13. The memory device of claim 1, wherein the controller performs the re-mapping for multiple banks at the same time.

14. The memory device of claim 3, wherein the mode register includes a control bit, and wherein a command directed to one of the first unit of the primary storage cells and the spare unit of storage cells is automatically directed by the controller to both the first unit of the primary storage cells and the spare unit of storage cells if the control bit is set.

15. A method of automatically self-healing a defective unit of storage cells in a volatile memory device while power is being supplied to the memory device, the method comprising:
   providing a spare unit of storage cells in the memory device;
   identifying the defective unit of storage cells with no user intervention;
   receiving a heal command issued in response to the identified defect; and
   automatically re-directing accesses directed to the defective unit of storage cells to the spare unit of storage cells based on the heal command.

16. The method recited in claim 15, and further comprising providing a mode register storing mode information, and wherein the re-directing step is performed based on the mode information.

17. The method recited in claim 16, wherein the mode register is programmable.

18. The method recited in claim 15, wherein the memory device is a synchronous dynamic random access memory.

19. The method recited in claim 15, wherein the memory device is a double data rate synchronous dynamic random access memory.

20. The method recited in claim 15, wherein the memory device includes a plurality of memory banks, each bank organized into a plurality of rows and a plurality of columns of storage cells, and wherein the spare unit of storage cells is a spare row of storage cells.

21. The method recited in claim 16, wherein the mode register includes a control bit, and wherein the re-directing step is performed when an activate command is received only if the control bit is set.

22. The method recited in claim 15, and further comprising storing status information regarding the re-directing step in a non-volatile memory.

23. The method recited in claim 22, wherein the status information comprises a first address identifying the defective unit of storage cells.

24. The method recited in claim 23, wherein the status information further comprises a second address identifying the spare unit of storage cells.

25. The method recited in claim 22, wherein the non-volatile memory is an EEPROM.

26. The method recited in claim 15, and further comprising:
   receiving an unheal command; and
   stopping the re-directing of accesses based on the unheal command.

27. The method recited in claim 15, wherein the memory device includes a plurality of banks of storage cells, and the re-directing step is performed for multiple banks in response to the heal command.

28. The method recited in claim 16, wherein the mode register includes a control bit, the method further comprising:
   receiving a command directed to one of the defective unit of storage cells and the spare unit of storage cells;
   automatically directing the command to both the defective unit of storage cells and the spare unit of storage cells if the control bit is set.

* * * * *